(12) United States Patent  (10) Patent No.: US 9,240,444 B2
Siddiqui  (45) Date of Patent: Jan. 19, 2016

(54) HIGH-VOLTAGE SEMICONDUCTOR DEVICE WITH A TERMINATION STRUCTURE

(71) Applicant: Nuvoton Technology Corporation, Hsinchu (TW)

(72) Inventor: MD Imran Siddiqui, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 14/287,061

(22) Filed: May 26, 2014

(65) Prior Publication Data

US 2015/0340432 A1  Nov. 26, 2015

(51) Int. Cl.
  *H01L 29/06*  (2006.01)
  *H01L 29/10*  (2006.01)
  *H01L 29/78*  (2006.01)
  *H01L 29/739*  (2006.01)

(52) U.S. Cl.
  CPC ........ *H01L 29/0615* (2013.01); *H01L 29/0619* (2013.01); *H01L 29/0638* (2013.01); *H01L 29/1095* (2013.01); *H01L 29/7395* (2013.01); *H01L 29/7811* (2013.01)

(58) Field of Classification Search
  CPC ............ H01L 29/7811; H01L 29/7395; H01L 29/0619
  See application file for complete search history.

(56) References Cited

U.S. PATENT DOCUMENTS

| 5,032,878 A | 7/1991 | Davies et al. |
| 5,075,739 A | 12/1991 | Davies |
| 6,215,168 B1 | 4/2001 | Brush et al. |
| 7,768,093 B2 | 8/2010 | Schulze et al. |
| 7,880,272 B2 | 2/2011 | Schmidt |
| 8,564,088 B2 * | 10/2013 | Schmidt ........................ 257/493 |
| 8,618,576 B1 * | 12/2013 | Schmidt ........................ 257/144 |
| 2007/0222023 A1 * | 9/2007 | Schmidt ........................ 257/499 |
| 2007/0272979 A1 * | 11/2007 | Saito et al. .................... 257/335 |
| 2010/0001344 A1 * | 1/2010 | Stefanov et al. .............. 257/339 |
| 2013/0320462 A1 * | 12/2013 | Tipirneni et al. ............. 257/409 |
| 2014/0048843 A1 * | 2/2014 | Chen, Xingbi ............... 257/133 |
| 2015/0187874 A1 * | 7/2015 | Hirler et al. .................. 257/139 |

OTHER PUBLICATIONS

Kao and Wolley, "High-Voltage Planar p-n Junctions," Proceedings of the IEEE, Aug. 1967, pp. 1409-1414.

Temple, "Junction Termination Extension(JTE), A New Technique for Increasing Avalanche Breakdown Voltage and Controlling Surface Electric Fields in p-n Junctions," 1977 International Electron Devices Meeting, Dec. 5-7, 1977, pp. 423-426.

(Continued)

*Primary Examiner* — Lex Malsawma
*Assistant Examiner* — Xia L Cross
(74) *Attorney, Agent, or Firm* — Jianq Chyun IP Office

(57) ABSTRACT

A semiconductor device is disclosed. A substrate of a first conductivity type is provided. The substrate has a first area and a second area. An epitaxial layer of a second conductivity type is disposed on the front side of the substrate. A first doped region of the first conductivity type is disposed in the epitaxial layer in the first area, wherein a doping depth of the first doped region is gradually decreased away from the second area. At least one second doped region of the second conductivity type is disposed in the first doped region, wherein a doping depth of the at least one second doped region is gradually increased away from the second area. A dielectric layer is disposed on the epitaxial layer. A first conductive layer is disposed on the dielectric layer.

20 Claims, 4 Drawing Sheets

(56) References Cited

OTHER PUBLICATIONS

Stengl., "Variation of Lateral Doping as a Field Terminator for High-Voltage Power Devices," IEEE Transactions on Electron Devices, Mar. 1986, pp. 426-428.

Conti and Conti, "Surface Breakdown in Silicon Planar Diodes Equipped with Field Plate," Solid-State Electronics, Jan. 1972, pp. 93-105.

* cited by examiner

HIGH-VOLTAGE SEMICONDUCTOR DEVICE WITH A TERMINATION STRUCTURE

BACKGROUND OF THE INVENTION

1. Field of Invention

The present invention relates to a semiconductor device, and particularly to a high-voltage semiconductor device.

2. Description of Related Art

High-voltage semiconductor devices are widely adopted in current electronic products. With the demand for light, compact and multi-functional products, an insulated gate bipolar transistor (IGBT) combining the features of metal oxide semiconductor field effect transistor (MOSFET) and bipolar junction transistor (BJT) have become the main stream in the industry.

In order to prevent voltage breakdown at the edge of a high-voltage semiconductor device, the device is provided with a termination structure.

SUMMARY OF THE INVENTION

An embodiment of the present invention provides a semiconductor device. A substrate of a first conductivity type is provided. The substrate has a first area and a second area. An epitaxial layer of a second conductivity type is disposed on the front side of the substrate. A first doped region of the first conductivity type is disposed in the epitaxial layer in the first area, wherein a doping depth of the first doped region is gradually decreased away from the second area. At least one second doped region of the second conductivity type is disposed in the first doped region, wherein a doping depth of the at least one second doped region is gradually increased away from the second area. A dielectric layer is disposed on the epitaxial layer. A first conductive layer is disposed on the dielectric layer.

Another embodiment of the present invention provides a semiconductor device. A substrate of a first conductivity type is provided. The substrate has a first area and a second area. An epitaxial layer of a second conductivity type is disposed on the front side of the substrate. A first doped region of the first conductivity type is disposed in the epitaxial layer in the first area, wherein a doping concentration of the first doped region is gradually decreased away from the second area. At least one second doped region of the second conductivity type is disposed in the first doped region, wherein a doping concentration of the at least one second doped region is gradually increased away from the second area. A dielectric layer is disposed on the epitaxial layer. A first conductive layer is disposed on the dielectric layer.

In order to make the aforementioned and other objects, features and advantages of the present invention comprehensible, several embodiments accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
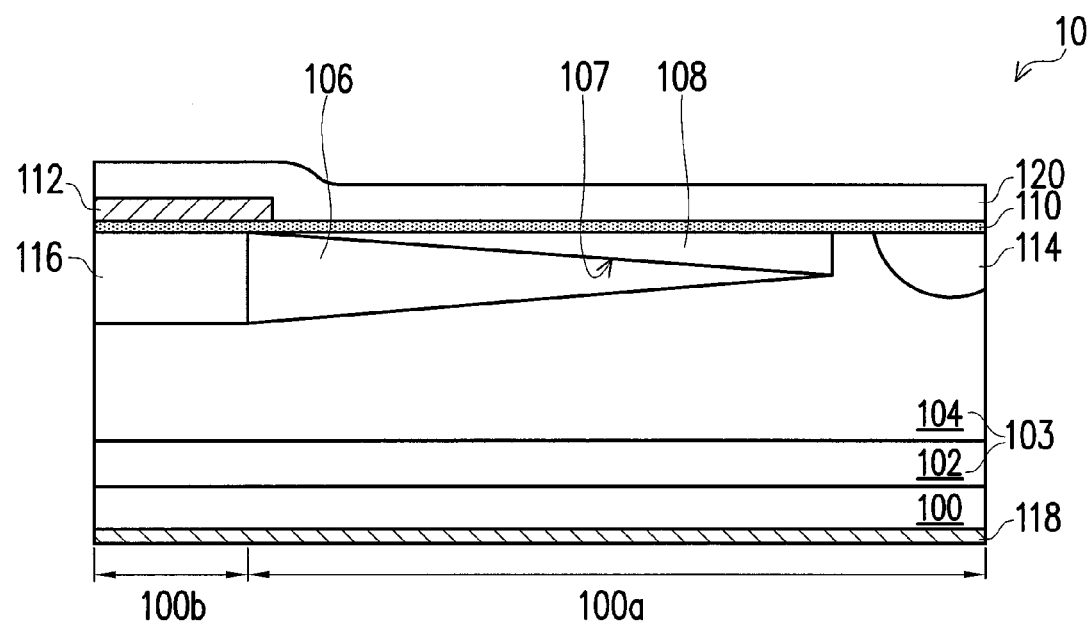
FIG. 1 schematically illustrates a cross-sectional view of a semiconductor device according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

A termination structure can utilize a single ring-shaped doped region surrounding the active area. However, the space charge may penetrate into the termination area and thus the performance of the termination structure is deteriorated.

Accordingly, an embodiment of the present invention provides a semiconductor device with a novel edge termination structure, in which the junction termination extension (JTE) region can be composed of a first doped region with a linearly-degraded doping profile away from the active area and at least one second doped region with a linearly-degraded doping profile towards the active area, and the first and second doped regions have different conductivity types. Such JTE region can help to effectively reduce the space charge effect near the surface region of JTE. Therefore, the electric field in the surface region of the termination area can be effectively reduced and the performance of the device can be accordingly improved.

FIG. 1 schematically illustrates a cross-sectional view of a semiconductor device according to an embodiment of the present invention.

Referring to FIG. 1, the semiconductor device 10 of an embodiment of the present invention includes a substrate 100 of a first conductivity type, an epitaxial layer 103 of a second conductivity type, a first doped region 106 of the first conductivity type, at least one second doped region 108 of the second conductivity type, a dielectric layer 110, a first conductive layer 112 and a second conductive layer 118.

The substrate 100 can be a heavily P-doped (P$^+$) silicon-containing substrate having a P-type dopant therein. The P-type dopant includes boron, for example. The substrate 100 can serve as a drain region of the device.

Besides, the substrate 100 has a first area 100a and a second area 100b. The first area 100a and the second area 100b are adjacent to each other. In an embodiment, the first area 100a surrounds the second area 100b. In this embodiment, the first area 100a can be a termination area for preventing voltage breakdown at an edge of the semiconductor device. The second area 100b can be an active area or a cell area for determining the performance (such as switching characteristics) of the semiconductor device.

The epitaxial layer 103 is disposed on the front side of the substrate 100 in the first and second areas 100a and 100b. The epitaxial layer 103 can be an N-type doped region having an N-type dopant therein. The N-type dopant includes phosphorus or arsenic, for example. In this embodiment, the epitaxial layer 103 includes a heavily N-doped (N$^+$) buffer epitaxial layer 102 and a lightly N-doped (N$^-$) drift epitaxial layer 104 disposed on the buffer epitaxial layer 102. In other words, the buffer epitaxial layer 102 has a doping concentration greater than that of the drift epitaxial layer 104. Besides, the doping concentration of the buffer epitaxial layer 102 or the drift epitaxial layer 104 is substantially constant. In this embodiment, the epitaxial layer 103 is composed by a heavily N-doped (N+) buffer epitaxial layer 102 and a lightly N-doped (N−) drift epitaxial layer 104, however, the present invention is not limited thereto. For example, the epitaxial layer 103 can be a single layer having uniform doping concentration.

The first doped region 106 is disposed in the drift epitaxial layer 104 of the epitaxial layer 103 in the first area 100a. The first doped region 106 can be a lightly P-doped (P−) region, for example. Besides, the doping depth of the first doped region 106 is gradually decreased away from the second area 100b. In an embodiment, the deepest region of the first doped region 106 is the region close to the second area 100b and has a doping depth of about 4-6 μm, and the shallowest region of the first doped region 106 is the region away from the second area 100b and has a doping depth of about 1-3 μm.

Besides, the doping concentration of the first doped region 106 can be varied or gradient simultaneously. For example, the average doping concentration of the first doped region 106 is gradually decreased away from the second area 100b. In an embodiment, the deepest region of the first doped region 106 is the region close to the second area 100b and has a doping concentration distribution of about $1\times10^{14}/cm^3$ to $3\times10^{17}/cm^3$, and the shallowest region of the first doped region 106 is the region away from the second area 100b and has a doping concentration distribution of about $1\times10^{15}/cm^3$ to $1\times10^{16}/cm^3$, wherein the deepest region of first doped region 106 has an average doping concentration higher than that of the shallowest region of the first doped region 106.

The at least one second doped region 108 is disposed in the first doped region 106. In this embodiment, the at least one second doped region 108 can be a bulk lightly N-doped (N−) region. Besides, the doping depth of the second doped region 108 is gradually increased away from the second area 100b. In an embodiment, the shallowest region of the second doped region 108 is the region close to the second area 100b and has a doping depth of about 0.5-1 μm, and the deepest region of the second doped region 108 is the region away from the second area 100b and has a depth of about 1-3 μm.

Besides, the doping concentration of the second doped region 108 can be varied or gradient simultaneously. Specifically, the average doping concentration of the second doped region 108 is gradually increased away from the second area 100b. In an embodiment, the shallowest region of the second doped region 108 is the region close to the second area 100b and has a doping concentration distribution of about $1\times10^{14}/cm^3$ to $1\times10^{15}/cm^3$, and the deepest region of the second doped region 108 is the region away from the second area 100b and has a doping concentration distribution of about $1\times10^{16}/cm^3$ to $1\times10^{17}/cm^3$, wherein the shallowest region of the second doped region 108 has an average doping concentration lower than that of the deepest region of the second doped region 108.

Herein, the first doped region 106 can be referred to as a region having a linearly-degraded doping depth/concentration profile away from the active area, and the second doped region 108 can be referred to as a region having a linearly-degraded doping depth/concentration profile towards the active area.

In this embodiment, both of the doping depth and doping concentration of the first and second doped regions 106 and 108 are varied away from the second area 100b for uniformly distributing the space charge and therefore preventing voltage breakdown at the edge of the device. However, the present invention is not limited thereto. In another embodiment, only the doping concentration of the first and second doped regions 106 and 108 is adjusted upon the process requirements. For example, the doping concentration of the first doped region 106 is gradually decreased away from the second area 100b, and the doping concentration of the second doped region 108 is gradually increased away from the second area 100b, while the doping depth of the first doped region 106 or the second doped region 108 keeps constant.

The dielectric layer 110 is disposed on the epitaxial layer 103 in the first and second areas 100a and 100b. The dielectric layer 110 include silicon oxide, borophosphosilicate glass (BPSG), phosphosilicate glass (PSG), fluorosilicate glass (FSG), undoped silicon glass (USG), silicon nitride, silicon oxynitride, a high-k material with a dielectric constant more than 4 or a combination thereof. In this embodiment, the dielectric layer 110 can be a silicon oxide layer, for example.

The first conductive layer 112 is disposed on the dielectric layer 110 in the first and second areas 100a and 100b. The first conductive layer 112 includes metal, such as aluminium, tungsten, copper or an alloy thereof. In this embodiment, the first conductive layer 112 serves as a source, an emitter or a field plate metal in the active area 100b. In another embodiment, the first conductive layer 112 can just cover the second area 100b.

The second conductive layer 118 is disposed on the backside of the substrate 100. The second conductive layer 118 includes metal, such as titanium, nickel, argentum or an alloy thereof. In this embodiment, the second conductive layer 118 serves as a drain or collector metal of the device. In addition, the material of the second conductive layer 118 can be the same as or different from that of the first conductive layer 112.

It is noted that in this embodiment, the junction termination extension (JTE) region in the termination area 100a is composed of the first doped region 106 and the second doped region 108 having a substantially smooth interface 107 therebetween. Such JTE region helps to reduce the surface charge effect near the surface of the termination area 100a, and further improves the distribution of the space charge in the dielectric layer 110. That is, the space charge can be uniformly distributed near the surface in the termination area 100a, so that voltage breakdown at the edge of the device can be avoided and the optimum high voltage of the device can be obtained.

In addition, the semiconductor device 10 of the embodiment of the present invention further includes a channel stopper 114 of the second conductivity type, a third doped region 116 of the first conductivity type and a passivation layer 120.

The channel stopper 114 can be an N+ doped region disposed in the drift epitaxial layer 104 of the epitaxial layer 103 in the first area 100a. In this embodiment, the channel stopper 114 is separated from the first and second doped regions 106 and 108. The channel stopper 114 is configured to limit the spread of the channel region or to prevent the formation of parasitic channels, thereby reducing the leakage current and improving the breakdown voltage. In other words, the semiconductor device 10 can be fully isolated from the adjacent device by disposition of the channel stopper 114.

The third doped region 116 can be a P− doped region disposed in the drift epitaxial layer 104 of the epitaxial layer 103 in the second area 100b. In this embodiment, the third doped region 116 is physically connected to the first doped region 106, but the present invention is not limited thereto. In another embodiment (not shown), the third doped region 116 can be separated from the first doped region 106, or can be coupled to the first doped region 106 through another component. The third doped region 116 can serve as a base region in the active area 100b.

The passivation layer 120 covers the substrate 100 in the first and second areas 100a and 100b. The passivation layer 120 is configured to protect the underlying device from being damaged and provide a planar topography. The passivation layer 120 includes silicon oxide, silicon nitride, silicon oxynitride or a combination thereof.

The embodiment of FIG. 1, in which the at least one second doped region is a bulk doped region 108, is provided for illustration purposes and is not construed as limiting the present invention. In another embodiment, the at least one second doped region can include a plurality of second doped regions, as shown in FIG. 2.

Figure 2:
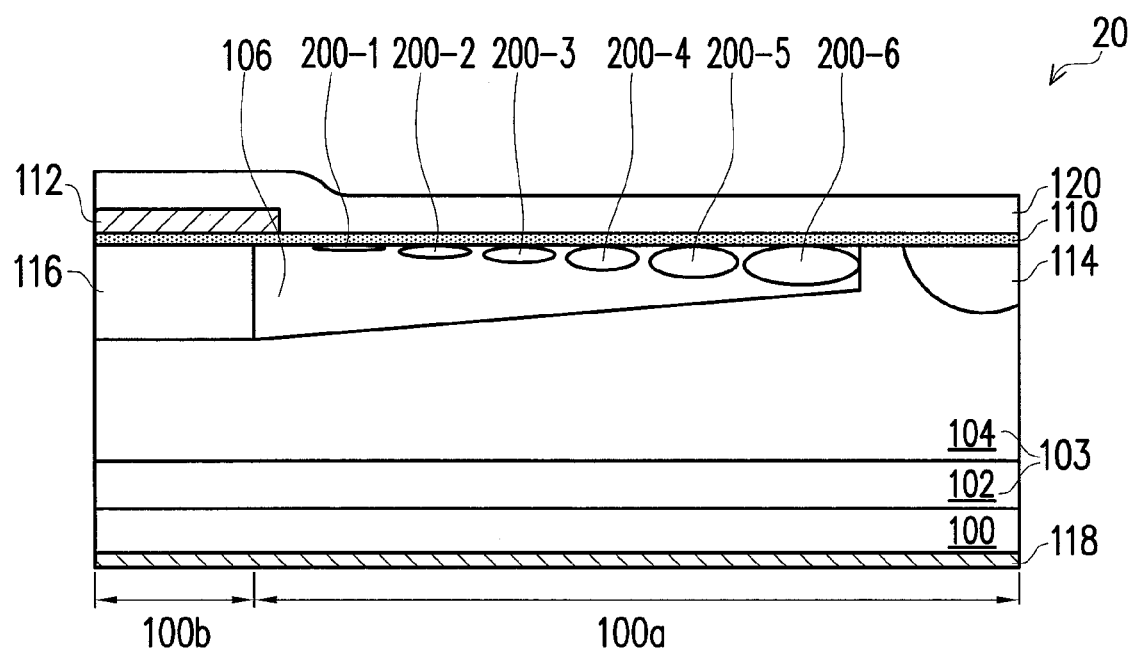
FIG. 2 schematically illustrates a cross-sectional view of a semiconductor device according to another embodiment of the present invention.

FIG. 2 schematically illustrates a cross-sectional view of a semiconductor device according to another embodiment of the present invention.

The embodiment of FIG. 2 is similar to that of FIG. 1, and the difference lies in that multiple doped regions 200-1 to 200-6 of FIG. 2 are disposed to replace the bulky doped region 108 of FIG. 1. The difference between them is described below and the similarities are not iterated herein.

As shown in the semiconductor device 20 of FIG. 2, a plurality of second doped regions 200-1 to 200-6 is disposed in the first doped region 106. Herein, an i-th second doped region is closer to the second area 100b than an (i+1)-th second doped region, the doping depth of the i-th second doped region is less than the doping depth of the (i+1)-th second doped region, and i is a positive integer. Specifically, the second doped region 200-1 has a doping depth less than that of the second doped region 200-2, the second doped region 200-2 has a doping depth less than that of the second doped region 200-3, the second doped region 200-3 has a doping depth less than that of the second doped region 200-4, the second doped region 200-4 has a doping depth less than that of the second doped region 200-5, and the second doped region 200-5 has a doping depth less than that of the second doped region 200-6. It is noted that in this embodiment, the second doped regions 200-1 to 200-6 are closely adjacent to but separated from each other.

Besides, the doping concentration of the second doped regions 200-1 to 200-6 can be varied or gradient simultaneously. Herein, an i-th second doped region is closer to the second area 100b than an (i+1)-th second doped region, the doping concentration of the i-th second doped region is less than the doping concentration of the (i+1)-th second doped region, and i is a positive integer. Specifically, the second doped region 200-1 has a doping concentration less than that of the second doped region 200-2, the second doped region 200-2 has a doping concentration less than that of the second doped region 200-3, the second doped region 200-3 has a doping concentration less than that of the second doped region 200-4, the second doped region 200-4 has a doping concentration less than that of the second doped region 200-5, and the second doped region 200-5 has a doping concentration less than that of the second doped region 200-6. In the embodiment of FIG. 2, both of the doping depth and concentration or only the doping concentration of the second doped regions 200-1 to 200-6 can be varied upon the process requirements.

The second doped regions 200-1 to 200-6 in FIG. 2 have the same function as that of the bulky doped region 108 in FIG. 1 for uniformly distributing the space charge and therefore preventing voltage breakdown at the edge of the device. In the embodiment of FIG. 2, the JTE region in the termination area 100a is composed of the first doped region 106 and multiple second doped regions 200-1 to 200-6.

Besides, in FIG. 2, a total of six of the second doped regions 200-1 to 200-6 is provided for illustration purposes. However, the number of the second doped regions is not limited by the present invention. That is, upon the process requirements, the number of the second doped regions can be two, three, four, five or more than six.

In the above-mentioned embodiments of FIG. 1 and FIG. 2, the first conductivity type is P-type and the second conductivity type is N-type, but the present invention is not limited thereto. In other embodiments, in the semiconductor devices 30 and 40 of FIG. 3 and FIG. 4, the first conductivity type can be N-type and the second conductivity type can be P-type.

Figure 3:
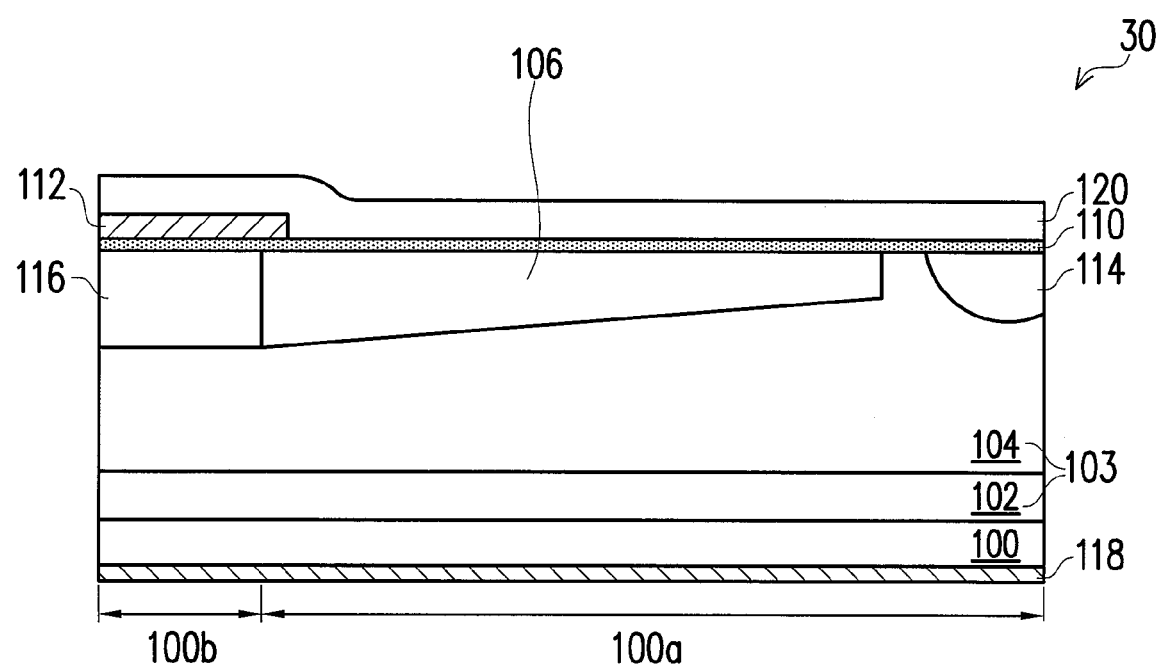
FIG. 3 schematically illustrates a cross-sectional view of a semiconductor device according to yet another embodiment of the present invention.

FIG. 3 schematically illustrates a cross-sectional view of a semiconductor device according to yet another embodiment of the present invention.

The embodiment of FIG. 3 is similar to that of FIG. 1, and the difference lies in that the second doped region 108 is omitted in FIG. 3. Herein, an N-type first doped region 106 is disposed in a P-type drift epitaxial layer 104 in the first area 100a and has a doping depth and/or a doping concentration gradually decreased away from the second area 100b. In the embodiment of FIG. 3, the JTE region in the termination area 100a is merely composed of the N-type doped region 106 for uniformly distributing the space charge and therefore preventing voltage breakdown at the edge of the device.

Figure 4:
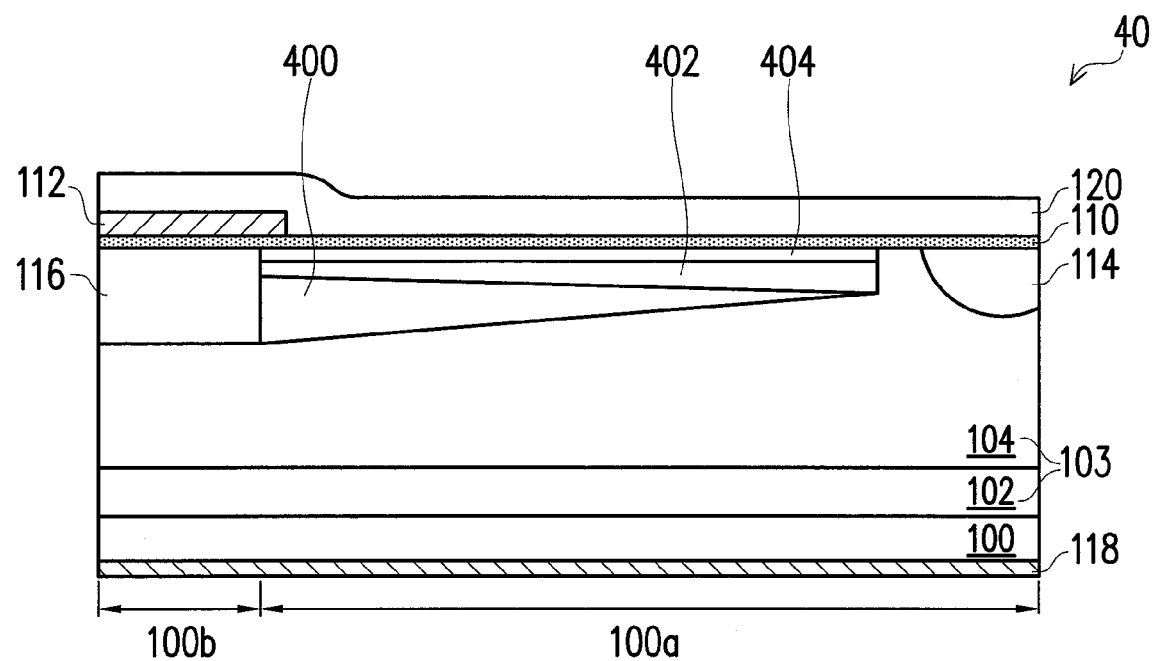
FIG. 4 schematically illustrates a cross-sectional view of a semiconductor device according to still another embodiment of the present invention.

FIG. 4 schematically illustrates a cross-sectional view of a semiconductor device according to still another embodiment of the present invention.

The embodiment of FIG. 4 is similar to that of FIG. 1, and the difference lies in that in FIG. 4, a fourth doped region is disposed in the second doped region, and the fourth doped region and the second doped region have different conductivity types. The difference between them is described below and the similarities are not iterated herein.

As shown in the semiconductor device 40 of FIG. 4, an N-type first doped region 400, a P-type second doped region 402 and an N-type fourth doped region 404 are disposed in a P-type drift epitaxial region 104 in the first area 100a. The first, second and fourth doped regions 400, 402 and 404 can be all lightly doped.

Specifically, the P-type second doped region 402 is disposed in the N-type first doped region 400, and the N-type fourth doped region 404 is disposed in the P-type second doped region 402. The N-type first doped region 400 has a doping depth and/or a doping concentration gradually decreased away from the second area 100b, while the P-type second doped region 402 has a doping depth and/or a doping concentration gradually decreased toward the second area 100b. In this embodiment, the N-type fourth doped region 404 has a substantially equal doping depth and/or a doping concentration in the first area 100a, but the present invention is not limited thereto. In another embodiment (not shown), the N-type fourth doped region 404 can have a doping depth and/or a doping concentration gradually decreased or increased toward the second area 100b.

Herein, in the embodiment of FIG. 4, the JTE region in the termination area 100a is composed of the N-type first doped region 400, the P-type second doped region 402 and the N-type fourth doped region 404 for uniformly distributing the space charge and therefore preventing voltage breakdown at the edge of the device.

In summary, the semiconductor device of an embodiment of the present invention provides a novel edge termination structure, in which the JTE is composed of a linearly-degraded P-type doping profile away from the active area (e.g. the first doped region 106) with a linearly-degraded N-type doping profile towards the active area (e.g. the second doped region 108) therein. Such JTE region effectively prevents the effect of the space charge from penetrating into the termination area. Therefore, the problem of mobile charge carriers in the dielectric layer (e.g. oxide layer) and on the surface of the semiconductor material (e.g. silicon) can be solved with the help of the linearly-degraded N-type doping profile (e.g. the second doped region 108) near the semiconductor material surface. Besides, the robust edge termination structure of the invention reduces the electric field and uniformly distributes the electric field away from the active area, and therefore helps to provide an optimum high voltage of the device.

The present invention has been disclosed above in the embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
   a substrate of a first conductivity type, having a first area and a second area;
   an epitaxial layer of a second conductivity type, disposed on a front side of the substrate;
   a first doped region of the first conductivity type, disposed in the epitaxial layer in the first area, wherein a doping depth of the first doped region is gradually decreased away from the second area;
   at least one second doped region of the second conductivity type, disposed in the first doped region, wherein a doping depth of the at least one second doped region is gradually increased away from the second area;
   a dielectric layer, disposed on the epitaxial layer; and
   a first conductive layer, disposed on the dielectric layer.

2. The semiconductor device of claim 1, wherein the at east one second doped region is a bulk doped region.

3. The semiconductor device of claim 2, wherein the first and the at least one second doped regions have a substantially smooth interface therebetween.

4. The semiconductor device of claim 1, wherein the at least one second doped region comprises a plurality of separate second doped regions, an i-th second doped region is closer to the second area than an (i+1)-th second doped region, a doping depth of the ith second doped region is less than a doping depth of the (i+1)-th second doped region, and i is a positive integer.

5. The semiconductor device of claim 1, wherein the epitaxial layer comprises a buffer epitaxial layer and a drift epitaxial layer disposed on the buffer epitaxial layer, and the first and the at least one second doped regions are disposed in the drift epitaxial layer.

6. The semiconductor device of claim 5, wherein a doping concentration of the buffer epitaxial layer is greater than a doping concentration of the drift epitaxial layer.

7. The semiconductor device of claim 1, further comprising a channel stopper of the second conductivity type disposed in the epitaxial layer in the first area, wherein the channel stopper is separated from the first and the at least one second doped regions.

8. The semiconductor device of claim 1, further comprising a third doped region of the first conductivity type disposed in the epitaxial layer in the second area, wherein the third doped region is physically connected to the first doped region.

9. The semiconductor device of claim 1, wherein the first conductivity type is P-type and the second conductivity type is N-type.

10. The semiconductor device of claim 1, wherein the first conductivity type is N-type and the second conductivity type is P-type.

11. The semiconductor device of claim 10, further comprising a fourth doped region of the first conductivity type disposed in the at least one second doped region.

12. The semiconductor device of claim 1, wherein the first area is a termination area for preventing voltage breakdown at an edge of the semiconductor device and the second area is an active area.

13. The semiconductor device of claim 1, further comprising a second conductive layer disposed on a backside of the substrate.

14. A semiconductor device, comprising:
   a substrate of a first conductivity type, having a first area and a second area;
   an epitaxial layer of a second conductivity type, disposed on a front side of the substrate;
   a first doped region of the first conductivity type, disposed in the epitaxial layer in the first area, wherein a doping concentration of the first doped region is gradually decreased away from the second area;
   at least one second doped region of the second conductivity type, disposed in the first doped region, wherein a doping concentration of the at least one second doped region is gradually increased away from the second area;
   a dielectric layer, disposed on the epitaxial layer; and
   a first conductive layer, disposed on the dielectric layer.

15. The semiconductor device of claim 14, wherein the at least one second doped region is a bulk doped region.

16. The semiconductor device of claim 15, wherein the first and the at least one second doped regions have a substantially smooth interface therebetween.

17. The semiconductor device of claim 14, wherein the at least one second doped region comprises a plurality of separate second doped regions, an i-th second doped region is closer to the second area than an (i+1)-th second doped region, a doping concentration of the ith second doped region is less than a doping concentration of the (i+1)-th second doped region, and i is a positive integer.

18. The semiconductor device of claim 14, further comprising a channel stopper of the second conductivity type disposed in the epitaxial layer in the first area, wherein the channel stopper is separated from the first and the at least one second doped regions.

19. The semiconductor device of claim 14, further comprising a third doped region of the first conductivity type disposed in the epitaxial layer in the second area, wherein the third doped region is physically connected to the first doped region.

20. The semiconductor device of claim 14, further comprising a fourth doped region of the first conductivity type disposed in the at least one second doped region, wherein the first conductivity type is N-type and the second conductivity type is P-type.

\* \* \* \* \*